(12) United States Patent
Sandhu

(10) Patent No.: US 8,979,564 B2
(45) Date of Patent: Mar. 17, 2015

(54) SOCKET HAVING A PIN PLATE WITH A PORT ALIGNED WITH A DIMPLE IN A POCKET OF A BASE PLATE

(71) Applicant: Data I/O Corporation, Redmond, WA (US)

(72) Inventor: Jaswant Sandhu, Newcastle, WA (US)

(73) Assignee: Data I/O Corporation, Redmond, WA (US)

( * ) Notice: Subject to any disclaimer, the term of this patent is extended or adjusted under 35 U.S.C. 154(b) by 70 days.

(21) Appl. No.: 13/844,062

(22) Filed: Mar. 15, 2013

(65) Prior Publication Data

US 2014/0273574 A1    Sep. 18, 2014

(51) Int. Cl.
 *H01R 13/64* (2006.01)
 *H01R 43/16* (2006.01)
(52) U.S. Cl.
 CPC ..................................... *H01R 13/64* (2013.01)
 USPC ............................................ 439/247; 29/874

(58) Field of Classification Search
 USPC ......... 439/68, 69, 246–247, 248; 29/874, 825
 See application file for complete search history.

(56) References Cited

U.S. PATENT DOCUMENTS

| | | | |
|---|---|---|---|
| 4,998,887 A * | 3/1991 | Kaufman et al. | 439/78 |
| 6,234,817 B1 * | 5/2001 | Hwang | 439/247 |
| 6,541,991 B1 * | 4/2003 | Hornchek et al. | 324/754.07 |
| 6,794,335 B2 * | 9/2004 | Landes et al. | 504/128 |
| 6,988,310 B2 * | 1/2006 | Advocate et al. | 29/825 |
| 7,579,826 B2 | 8/2009 | Lee | |
| 7,670,177 B2 * | 3/2010 | Myer et al. | 439/595 |
| 7,924,039 B2 | 4/2011 | Chen et al. | |
| 2013/0224970 A1 * | 8/2013 | Sandhu et al. | 439/68 |

* cited by examiner

*Primary Examiner* — Chandrika Prasad
(74) *Attorney, Agent, or Firm* — Ishimaru & Associates LLP

(57) ABSTRACT

A method of manufacture of a self-cleaning socket system includes: providing a base plate having a gas pocket with a dimple; and coupling a pin plate having a compressed gas port to the base plate with the compressed gas port aligned with the dimple.

20 Claims, 4 Drawing Sheets

SOCKET HAVING A PIN PLATE WITH A PORT ALIGNED WITH A DIMPLE IN A POCKET OF A BASE PLATE

TECHNICAL FIELD

The present invention relates generally to socket system and more particularly to a system for utilizing a gas pocket in a socket system.

BACKGROUND

The rapidly growing market for portable electronic devices, e.g. cellular phones, laptop computers, and personal digital assistants (PDAs), is an integral facet of modern life. The multitude of portable devices represents one of the largest potential market opportunities for next generation integrated circuit devices. These devices have unique attributes that have significant impacts on manufacturing integration, in that they must be generally small, lightweight, and rich in functionality and they must be produced in high volumes at relatively low cost.

Manufacturing and designing integrated circuit devices is at the very core of next generation electronics insertion strategies outlined in road maps for development of next generation products. Future electronic systems can be more intelligent, have higher density, use less power, operate at higher speed, and can include mixed technology devices and assembly structures at lower cost than today.

There have been many approaches to addressing the advanced design and manufacturing requirements of integrated circuit devices and portable electronics with successive generations of semiconductors. The limitations and issues with current testing and programming platforms include increasing longevity, durability, operational time, and cost.

As these systems evolve to incorporate more components with varied environmental needs, the pressure to push the technological envelope becomes increasingly challenging. More significantly, with the ever-increasing complexity, the potential risk of error increases greatly during manufacture.

In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Thus, a need remains for more robust and capable socket systems and methods for manufacture. Solutions to these problems have been long sought but prior developments have not taught or suggested any solutions and, thus, solutions to these problems have long eluded those skilled in the art.

DISCLOSURE OF THE INVENTION

The present invention provides a method of manufacture of a self-cleaning socket system, including: providing a base plate having a gas pocket with a dimple; and coupling a pin plate having a compressed gas port to the base plate with the compressed gas port aligned with the dimple.

The present invention provides a self-cleaning socket system, including: a base plate having a gas pocket with a dimple; and a pin plate having a compressed gas port coupled to the base plate with the compressed gas port aligned with the dimple.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1:
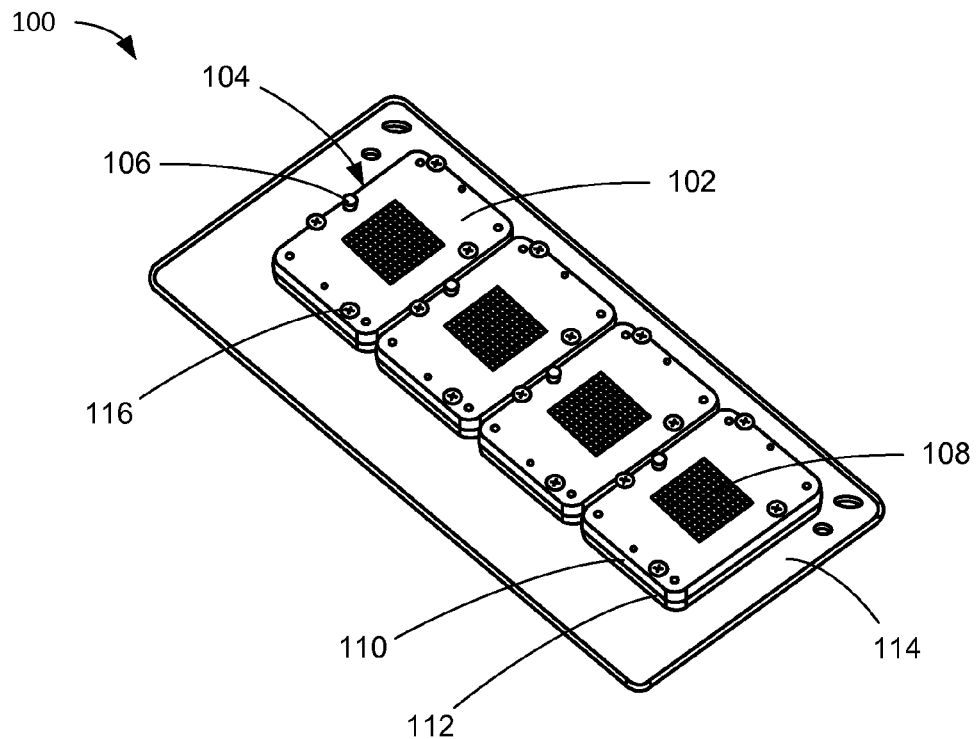
FIG. 1 is a bottom isometric view of a self-cleaning socket system an embodiment of the present invention.

The following embodiments are described in sufficient detail to enable those skilled in the art to make and use the invention. It is to be understood that other embodiments would be evident based on the present disclosure, and that system, process, or mechanical changes can be made without departing from the scope of the present invention.

In the following description, numerous specific details are given to provide a thorough understanding of the invention. However, it will be apparent that the invention can be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

In addition, where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane of a bottom surface of the pin plate, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact between elements without having any intervening material.

The term "processing" as used herein includes deposition of material or photoresist, patterning, exposure, development, etching, cleaning, and/or removal of the material or photoresist as required in forming a described structure.

Referring now to FIG. 1, therein is shown a bottom isometric view of a self-cleaning socket system 100 an embodiment of the present invention. The self-cleaning socket system 100 can be shown with a bottom surface 102 of a pin plate 104. The pin plate 104 can be flat and rectangular shaped and can include a compressed gas port 106 for example but the pin plate 104 can also include multiple compressed gas ports.

The compressed gas port 106 can be along one edge of a perimeter region of the pin plate 104. Near a center of the pin plate 104 can be exhaust holes 108 in an array formation. The exhaust holes 108 can be arranged in a square array, a rectangular array, or other geometric shape depending on the design needs of the self-cleaning socket system 100 to interface with contacts of devices (Not Shown) being programmed or tested.

The pin plate 104 can be coupled directly to a base plate 110. The base plate 110 can be coupled directly to a floating plate 112 but can also be coupled with other elements therebetween. The floating plate 112 can be coupled in direct contact with a board 114. Coupling the board 114 to the floating plate 112 to the base plate 110 to the pin plate 104, are connectors 116. The connectors 116 are defined as a structure spanning multiple layers such as the floating plate 112, the pin plate 104, or the base plate 110 to mechanically couple the layers to each other. The connectors 116 can be a screw, a bolt, a rivet, a similar coupling device, or a combination thereof.

The connectors 116 can extend from the bottom surface 102 of the pin plate 104 through the pin plate 104, through the base plate 110, through the floating plate 112, and into or through the board 114. The connectors 116 can physically compress the floating plate 112 to the board 114, the base plate 110 to the floating plate 112, and the pin plate 104 to the base plate 110 to restrain movement during operation of the self-cleaning socket system 100. The connectors 116 can be removed to release the pin plate 104 from the base plate 110 from the floating plate 112 from the board 114. Removing the connectors 116 can allow the self-cleaning socket system 100 to be disassembled for maintenance of broken or worn pieces of the self-cleaning socket system 100.

The connectors 116 can also seal the pin plate 104 the base plate 110 so that gas from the compressed gas port 106 does not leak out from between the pin plate 104 and the base plate 110 but will instead be exhausted from the exhaust holes 108. The self-cleaning socket system 100 can be arrayed with other socket systems on the board 114 in any configuration required for testing or programming of devices.

Figure 2:
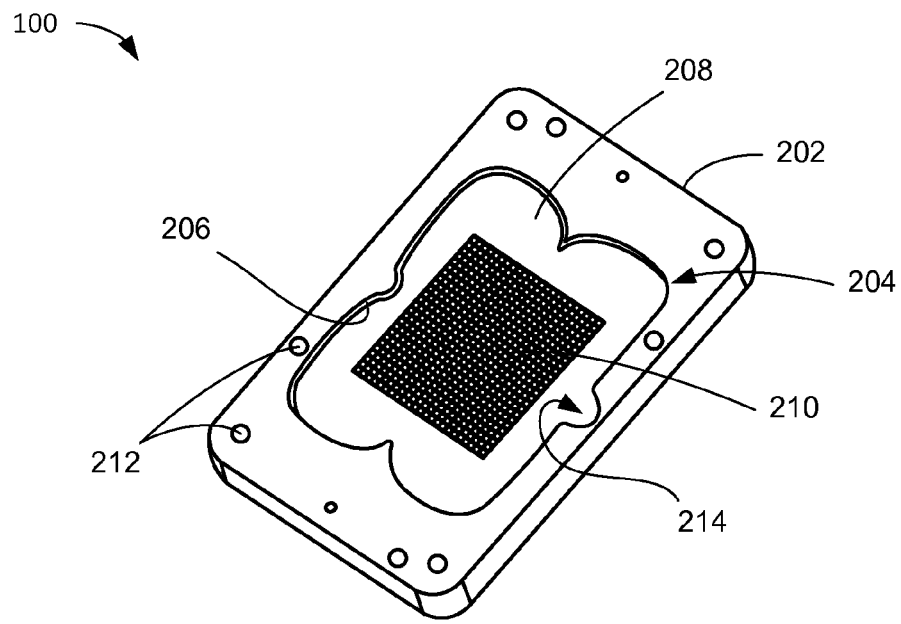
FIG. 2 is a bottom isometric view of the base plate of FIG. 1.

Referring now to FIG. 2, therein is shown a bottom isometric view of the base plate 110 of FIG. 1. The base plate 110 can have a bottom surface 202. The bottom surface 202 of the base plate 110 can have a gas pocket 204 as a relief extending into the base plate 110 from the bottom surface 202. The gas pocket 204 is defined as a gas reservoir formed partially into the base plate 110.

The gas pocket 204 can be machined etched or pressed into the base plate 110. The gas pocket 204 can include a dam 206 extending from the bottom surface 202 of the base plate 110 to a top surface 208 of the gas pocket 204.

The dam 206 can extend along a perimeter area of the base plate 110 and be formed to increase gas flow and channel gas flow around pin holes 210 in the top surface of the gas pocket 204. The dam 206 is further shown avoiding through holes 212 that the connectors 116 of FIG. 1 can be threaded through or other structures such as alignment pins (not shown). The gas pocket 204 can have a dimple 214 that corresponds to the gas pocket 204 of FIG. 1. The dimple 214 of the gas pocket 204 is defined within the dam 206.

Figure 3:
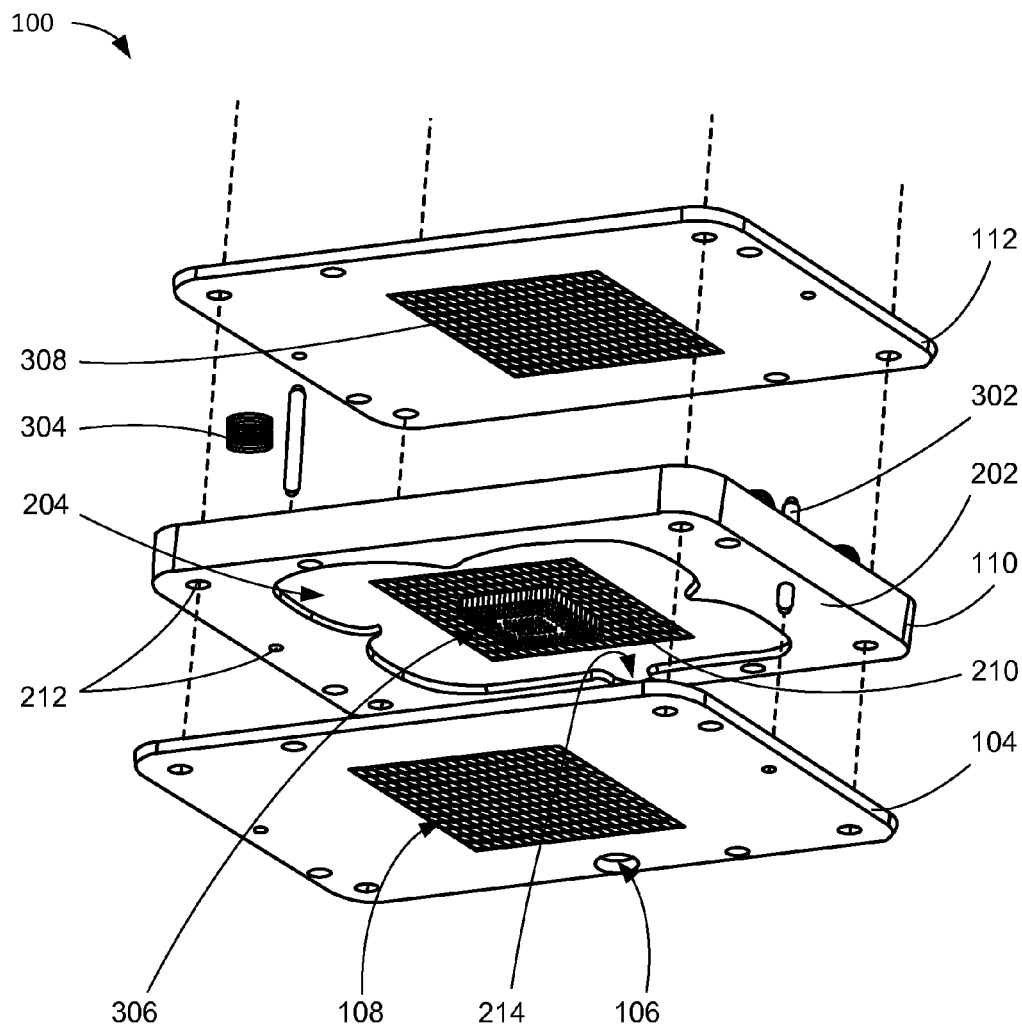
FIG. 3 is a bottom exploded isometric view of the self-cleaning socket system of FIG. 1.

Referring now to FIG. 3, therein is shown a bottom exploded isometric view of the self-cleaning socket system 100 of FIG. 1. The self-cleaning socket system 100 can be shown having the pin plate 104 below the base plate 110. The base plate 110 can be shown below the floating plate 112.

The gas pocket 204 on the bottom surface of the base plate 110 can be seen corresponding to and confined within a horizontal perimeter of the pin plate 104. The dimple 214 of the gas pocket 204 can be seen aligned over and covering the compressed gas port 106 of the pin plate 104. The gas pocket 204 can further be shown as encompassing and extending horizontally beyond the exhaust holes 108 of the pin plate 104.

Alignment pins 302 can be shown extending from the through holes 212. The alignment pins 302 can align the pin plate 104 with the base plate 110 and with the floating plate 112. The alignment pins 302 can ensure that the gas pocket 204 fully covers all of the exhaust holes 108 and that gas does not leak from between the pin plate 104 and the base plate 110.

Flexors 304 can be sandwiched between the base plate 110 and the floating plate 112. The flexors 304 can ensure that the floating plate 112 has a small gap between the floating plate 112 and the base plate 110. The flexors 304 can increase the lifespan of the self-cleaning socket system 100 by reducing the stress and shock from plugging and unplugging devices for testing and programming. The flexors 304 can be helical springs of metal, or polymer, rubber bumps or pillars.

Contact pins 306 can be sandwiched between the pin plate 104 and the base plate 110. The contact pins 306 can be positioned in the pin holes 210 and extend below the bottom surface 202 of the base plate 110. The contact pins 306 can contact the pin plate 104 and help reduce stress and increase longevity of the self-cleaning socket system 100. The contact pins 306 also extend through the base plate 110 and align with input holes 308 in the floating plate 112.

It has been discovered that the compressed gas port 106 coupled to the dimple 214 and the gas pocket 204 can be utilized to clean the contact pins 306, the pin holes 210, the base plate 110, the floating plate 112, and the pin plate 104 by pressurized gas from the compressed gas port 106. Pressurized gas from the compressed gas port 106 can internally clean, dislodge, and exhaust particles from plugging and unplugging devices into the self-cleaning socket system 100.

It has been discovered that the compressed gas port 106 coupled with the gas pocket 204 greatly increases the longevity of the self-cleaning socket system 100 because all cleaning of the self-cleaning socket system 100 can be done internally with compressed gas reducing the need for caustic chemicals or rough brushes. It has also been discovered that the compressed gas port 106 coupled with the gas pocket 204 increases productivity and through-put of the self-cleaning socket system 100 since manual cleaning is greatly reduced or eliminated further reducing operation cost since operators are not required to manually clean the self-cleaning socket system 100.

Compressed gas can circulate through the compressed gas port 106 into the gas pocket 204. From the gas pocket 204, compressed gas can clean the contact pins from contamination and debris. The contamination and debris can then be exhausted through the exhaust holes 108. The compressed gas can be cycled on and off between programming and testing of devices or after every device is removed from the self-cleaning socket system 100. The cycling can be controlled by a solenoid.

Figure 4:
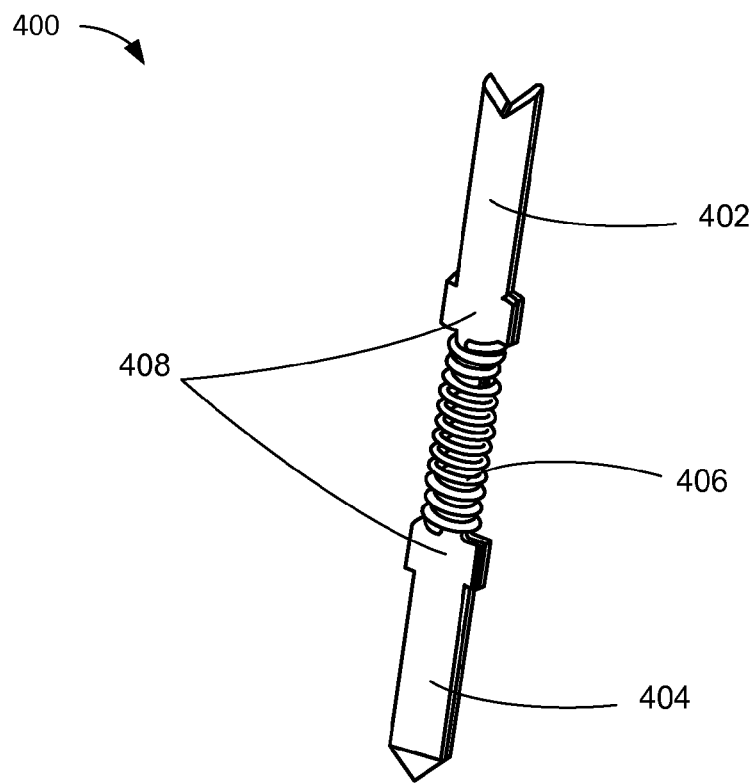
FIG. 4 is an isometric view of a contact pin for use in an embodiment of the present invention.

Referring now to FIG. 4, therein is shown an isometric view of a contact pin 400 for use in an embodiment of the present invention. The contact pin 400 can be shown having a contact portion 402 coupled to an anchor portion 404 below and connected with a spring 406.

The anchor portion 404 and the contact portion 402 can include stop bands 408. The stop bands 408 on the anchor portion 404 contact the exhaust holes 108 of FIG. 1. The stop bands 408 on the contact portion 402 contact the pin holes 210 of FIG. 2.

It has been discovered that the contact pin 400 can reduce the stress and increase longevity of the self-cleaning socket system 100 when coupled to the pin plate 104 of FIG. 1 and the base plate 110 of FIG. 1 by reducing shock and wear from metal tension. It has further been discovered that the shape of the anchor portion 404 and the contact portion 402 can improve gas flow during cleaning cycles of the self-cleaning socket system 100.

Figure 5:
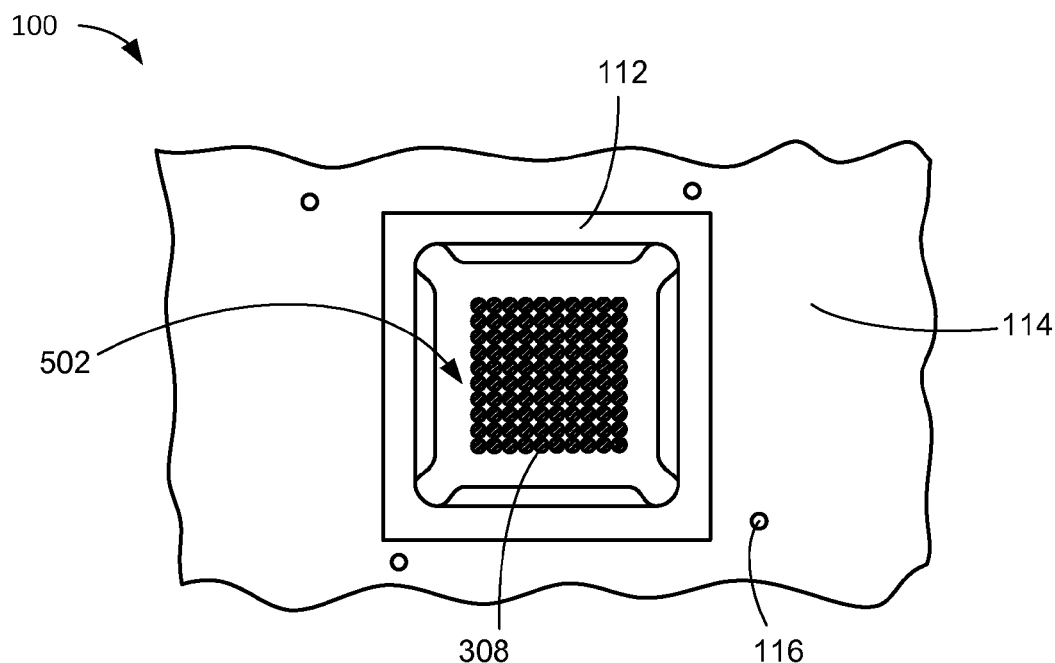
FIG. 5 is a top view of the self-cleaning socket system of FIG. 1.

Referring now to FIG. 5, therein is shown a top view of the self-cleaning socket system 100 of FIG. 1. The self-cleaning socket system 100 can be shown having the floating plate 112 connected to the board 114. Coupling the floating plate 112 to the board 114 are the connectors 116.

The floating plate 112 can have a cavity 502 with the input holes 308 at the bottom. The cavity 502 can be designed for a specific device or can be designed to be utilized for a broad range of devices depending on customer needs.

Figure 6:
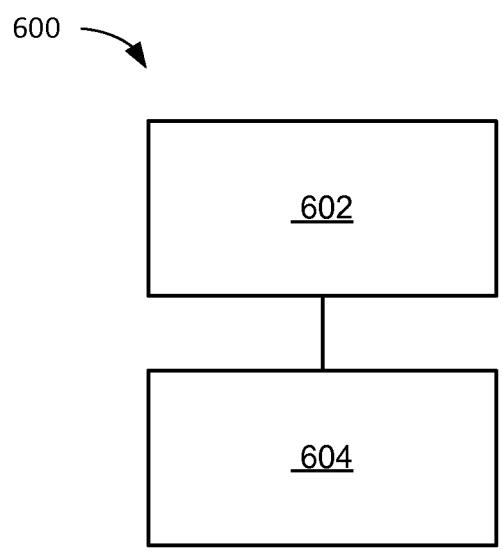
FIG. 6 is a flow chart of a method of manufacture of the self-cleaning socket system in a further embodiment of the present invention.

Referring now to FIG. 6, therein is shown a flow chart of a method 600 of manufacture of the self-cleaning socket system in a further embodiment of the present invention. The method 600 includes: providing a base plate having a gas pocket with a dimple in a block 602; and coupling a pin plate having a compressed gas port to the base plate with the compressed gas port aligned with the dimple in a block 604.

Thus, it has been discovered that the self-cleaning socket system and gas pocket of the present invention furnishes important and heretofore unknown and unavailable solutions, capabilities, and functional aspects for socket configurations. The resulting processes and configurations are straightforward, cost-effective, uncomplicated, highly versatile, accurate, sensitive, and effective, and can be implemented by adapting known components for ready, efficient, and economical manufacturing, application, and utilization.

Another important aspect of the present invention is that it valuably supports and services the historical trend of reducing costs, simplifying systems, and increasing performance. These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hitherto fore set forth herein or shown in the accompanying drawings are to be interpreted in an illustrative and non-limiting sense.

What is claimed is:

1. A method of manufacture of a self-cleaning socket system comprising:
   providing a base plate having a gas pocket with a dimple; and
   coupling a pin plate having a compressed gas port to the base plate with the compressed gas port aligned with the dimple.

2. The method as claimed in claim 1 wherein coupling the pin plate includes coupling the pin plate having an exhaust hole in a center of a bottom surface of the pin plate.

3. The method as claimed in claim 1 wherein coupling the pin plate to the base plate includes coupling with a connector through the base plate and the pin plate.

4. The method as claimed in claim 1 wherein coupling the pin plate includes encompassing a center portion of the pin plate with the gas pocket.

5. The method as claimed in claim 1 wherein providing the base plate includes providing the base plate having a pin hole.

6. A method of manufacture of a self-cleaning socket system comprising:
   providing a board;
   coupling a floating plate to the board;
   coupling a base plate, having a gas pocket with a dimple, to the floating plate;
   coupling a pin plate having a compressed gas port to the base plate with the compressed gas port aligned with the dimple; and
   coupling a solenoid to the compressed gas port.

7. The method as claimed in claim 6 wherein:
   coupling the base plate to the floating plate includes aligning the base plate with the floating plate with an alignment pin; and
   coupling the pin plate to the base plate includes aligning the pin plate to the base plate with the alignment pin.

8. The method as claimed in claim 6 wherein:
   coupling the base plate includes coupling the base plate having a pin hole connected to a contact pin within the pin hole; and
   coupling the pin plate includes coupling the pin plate having an exhaust hole in direct contact with the contact pin.

9. The method as claimed in claim 6 further comprising:
   fastening a connector through the pin plate, the base plate, and the floating plate to the board.

10. The method as claimed in claim 6 wherein coupling the base plate to the floating plate includes coupling the base plate to the floating plate with a flexor in between the base plate and the floating plate.

11. A self-cleaning socket system comprising:
    a base plate having a gas pocket with a dimple; and
    a pin plate having a compressed gas port coupled to the base plate with the compressed gas port aligned with the dimple.

12. The system as claimed in claim 11 wherein the pin plate has an exhaust hole in a center of a bottom surface of the pin plate.

13. The system as claimed in claim 11 further comprising a connector through the base plate and the pin plate coupling the pin plate to the base plate.

14. The system as claimed in claim 11 wherein the gas pocket encompasses a center portion of the base plate and the pin plate.

15. The system as claimed in claim 11 wherein the base plate has a pin hole.

16. The system as claimed in claim 11 further comprising:
    a floating plate coupled to the base plate;
    a board coupled to the floating plate; and
    a solenoid coupled to the compressed gas port.

17. The system as claimed in claim 16 further comprising an alignment pin aligning the base plate to the floating plate and the pin plate to the base plate.

18. The system as claimed in claim 16 wherein:
    the base plate includes a pin hole;
    the pin plate includes an exhaust hole; and
    further comprising:

a contact pin within the pin hole and in direct contact with the exhaust hole.

19. The system as claimed in claim 16 further comprising:
a connector through the pin plate, the base plate, and the floating plate and fastened to the board.

20. The system as claimed in claim 16 further comprising a flexor in between the base plate and the floating plate.

* * * * *